(12) United States Patent
Chinnakkonda Vidyapoornachary et al.

(10) Patent No.: US 9,330,737 B2
(45) Date of Patent: *May 3, 2016

(54) ALLOCATING MEMORY ADDRESS SPACE BETWEEN DIMMS USING MEMORY CONTROLLERS

(71) Applicant: International Business Machines Corporation, Armonk, NY (US)

(72) Inventors: Diyanesh B. Chinnakkonda Vidyapoornachary, Bangalore (IN); Prasanna Jayaraman, Bangalore (IN); Girisankar Paulraj, Bangalore (IN)

(73) Assignee: International Business Machines Corporation, Armonk, NY (US)

( * ) Notice: Subject to any disclaimer, the term of this patent is extended or adjusted under 35 U.S.C. 154(b) by 25 days.

This patent is subject to a terminal disclaimer.

(21) Appl. No.: 14/291,497

(22) Filed: May 30, 2014

(65) Prior Publication Data

US 2015/0279461 A1    Oct. 1, 2015

Related U.S. Application Data

(63) Continuation of application No. 14/227,593, filed on Mar. 27, 2014.

(51) Int. Cl.
*G06F 12/00* (2006.01)
*G11C 7/10* (2006.01)
*G11C 5/04* (2006.01)
*G11C 8/12* (2006.01)

(52) U.S. Cl.
CPC ............... *G11C 7/1072* (2013.01); *G11C 5/04* (2013.01); *G11C 8/12* (2013.01)

(58) Field of Classification Search
CPC ....... G06F 3/061; G06F 3/06231; G11C 5/04; G11C 8/12; G11C 7/1072

USPC .......... 711/105, 170, 171, E12.002
See application file for complete search history.

(56) References Cited

U.S. PATENT DOCUMENTS

| | | | |
|---|---|---|---|
| 7,421,598 B2 | 9/2008 | Brittain et al. | |
| 7,549,034 B2 * | 6/2009 | Foster, Sr. | G06F 1/3225 711/105 |
| 7,788,513 B2 | 8/2010 | Vaden et al. | |
| 8,010,764 B2 * | 8/2011 | Keller, Jr. | G06F 1/3225 711/157 |
| 8,024,594 B2 | 9/2011 | Yong et al. | |
| 8,095,725 B2 | 1/2012 | Kardach et al. | |
| 9,043,513 B2 * | 5/2015 | Perego | G06F 12/0246 710/3 |
| 2009/0083561 A1 | 3/2009 | Kaburlasos et al. | |

(Continued)

OTHER PUBLICATIONS

Chinnakkonda Vidyapoornachary et al., "Allocating Memory Address Space Between DIMMs Using Memory Controllers", U.S. Appl. No. 14/227,593, filed Mar. 27, 2014.

*Primary Examiner* — Pierre-Michel Bataille
(74) *Attorney, Agent, or Firm* — Richard A. Wilhelm; Robert Williams

(57) ABSTRACT

A memory controller enters a memory mode, allocating memory address space within a pair of dual in line memory modules (DIMMs) such that each DIMM of the pair contains unallocated memory address space corresponding to allocated memory space in the other DIMM. The memory controller enters another memory mode, modifying the allocation of the memory address space from a first DIMM of the pair of DIMMs to a second DIMM of the pair of DIMMs. The data is moved from allocated memory address space of the first DIMM to unallocated memory address space in the second DIMM.

8 Claims, 5 Drawing Sheets

(56) References Cited

U.S. PATENT DOCUMENTS

| | | | |
|---|---|---|---|
| 2010/0161909 A1* | 6/2010 | Nation | G06F 9/5016 711/147 |
| 2011/0035540 A1* | 2/2011 | Fitzgerald | G06F 3/061 711/103 |
| 2012/0005400 A1 | 1/2012 | Winderweedle | |
| 2013/0124786 A1 | 5/2013 | Doering et al. | |
| 2013/0138901 A1 | 5/2013 | Cordero et al. | |
| 2015/0178204 A1* | 6/2015 | Ray | G11C 5/04 711/103 |

* cited by examiner

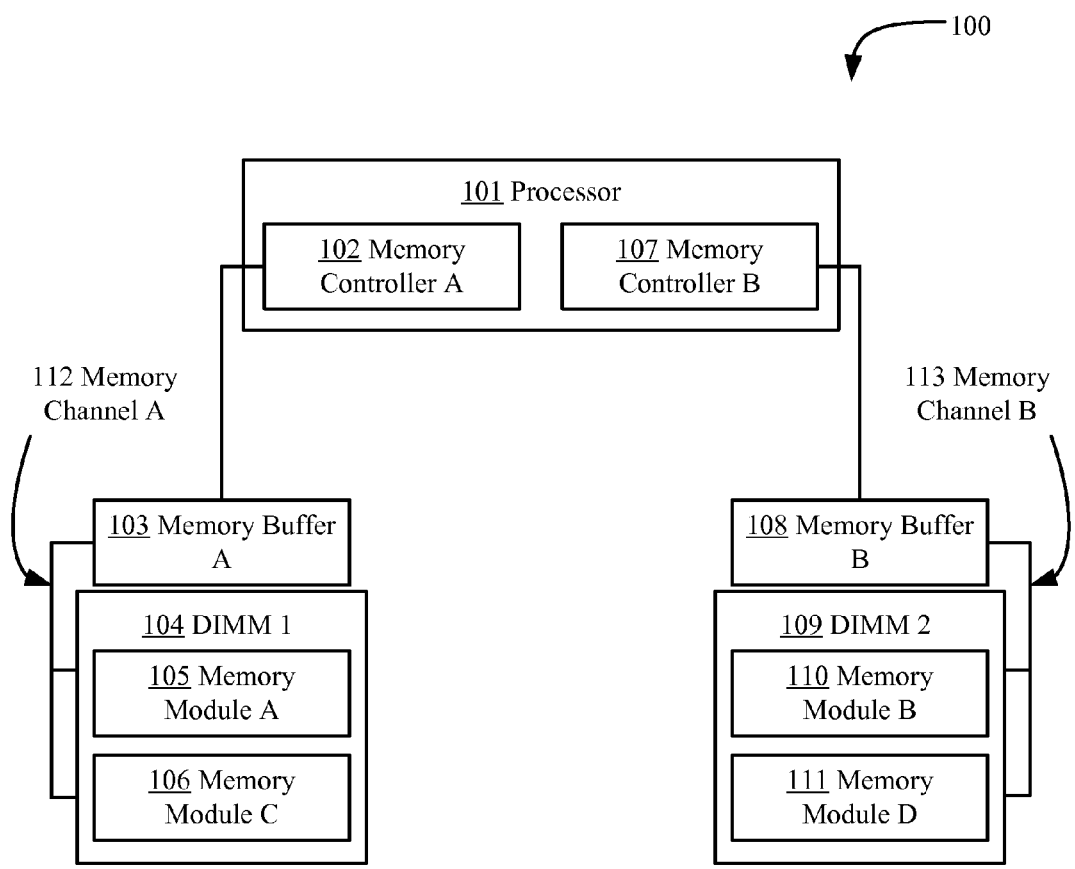
FIG. 1 – Memory System

ALLOCATING MEMORY ADDRESS SPACE BETWEEN DIMMS USING MEMORY CONTROLLERS

The present disclosure relates to data storage, more particular aspects relate to allocating memory address space between Dual In-line Memory Modules (DIMMs) using memory controllers. This application is a continuation of U.S. patent application Ser. No. 14/227,593, filed Mar. 27, 2014.

BACKGROUND

A memory controller is a circuit that controls memory. Furthermore, a memory controller manages the data flow going into and from memory. A DIMM or dual in-line memory module includes a series of memory modules and is designed for use in personal computers, workstations, and servers. A memory module is a broad term used to refer to a device that includes a set of random access memory circuits, such as dynamic random access memory integrated circuits mounted on a printed circuit board.

SUMMARY

According to embodiments of the present disclosure, a method for allocating memory address space between dual in line memory modules (DIMMs) using a memory controller configured to operate in a plurality of memory modes. In various embodiments, the method can include allocating, in response to entering a first memory mode of the plurality of memory modes, memory address space within a pair of DIMMs. The memory address space can be allocated such that each DIMM of the pair contains unallocated memory address space corresponding to allocated memory space in the other DIMM. The method can also include modifying, in response to entering a second memory mode of the plurality of memory modes, the allocation of the memory address space from a first DIMM of the pair of DIMMs to a second DIMM of the pair of DIMMs. Furthermore, the method can also include moving, in response to entering the second memory mode, data from allocated memory address space of the first DIMM to unallocated memory address space in a second DIMM.

According to embodiments of the present disclosure, a memory controller for allocating memory address space between dual in line memory modules (DIMMs). In various embodiments, the memory controller can be configured to allocate, in response to entering a first memory mode of a plurality of memory modes, memory address space within a pair of DIMMs. The memory address space can be allocated such that each DIMM of the pair contains unallocated memory address space corresponding to allocated memory space in the other DIMM. The memory controller can also be configured to modify, in response to entering a second memory mode of the plurality of memory modes, the allocation of the memory address space from a first DIMM of the pair of DIMMs to a second DIMM of the pair of DIMMs. Furthermore, the memory controller can be configured to move, in response to entering the second memory mode, data from allocated memory address space of the first DIMM to unallocated memory address space in the second DIMM.

According to embodiments of the present disclosure, a computer program product configured to allocate memory address space between dual in line memory modules (DIMMs) using a memory controller configured to operate in a plurality of memory modes. In various embodiments, the computer program product can allocate, in response to entering a first memory mode of the plurality of memory modes, memory address space within a pair of DIMMs. The memory address space can be allocated such that each DIMM of the pair contains unallocated memory address space corresponding to allocated memory space in the other DIMM. The computer program product can also modify, in response to entering a second memory mode of the plurality of memory modes, the allocation of the memory address space from a first DIMM of the pair of DIMMs to a second DIMM of the pair of DIMMS. Furthermore, the computer program product can also move, in response to entering the second memory mode, data from allocated memory address space of the first DIMM to unallocated memory address space in the second DIMM.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

FIG. 1 depicts a diagram of a memory system, consistent with embodiments of the present disclosure.

Figure 2A:
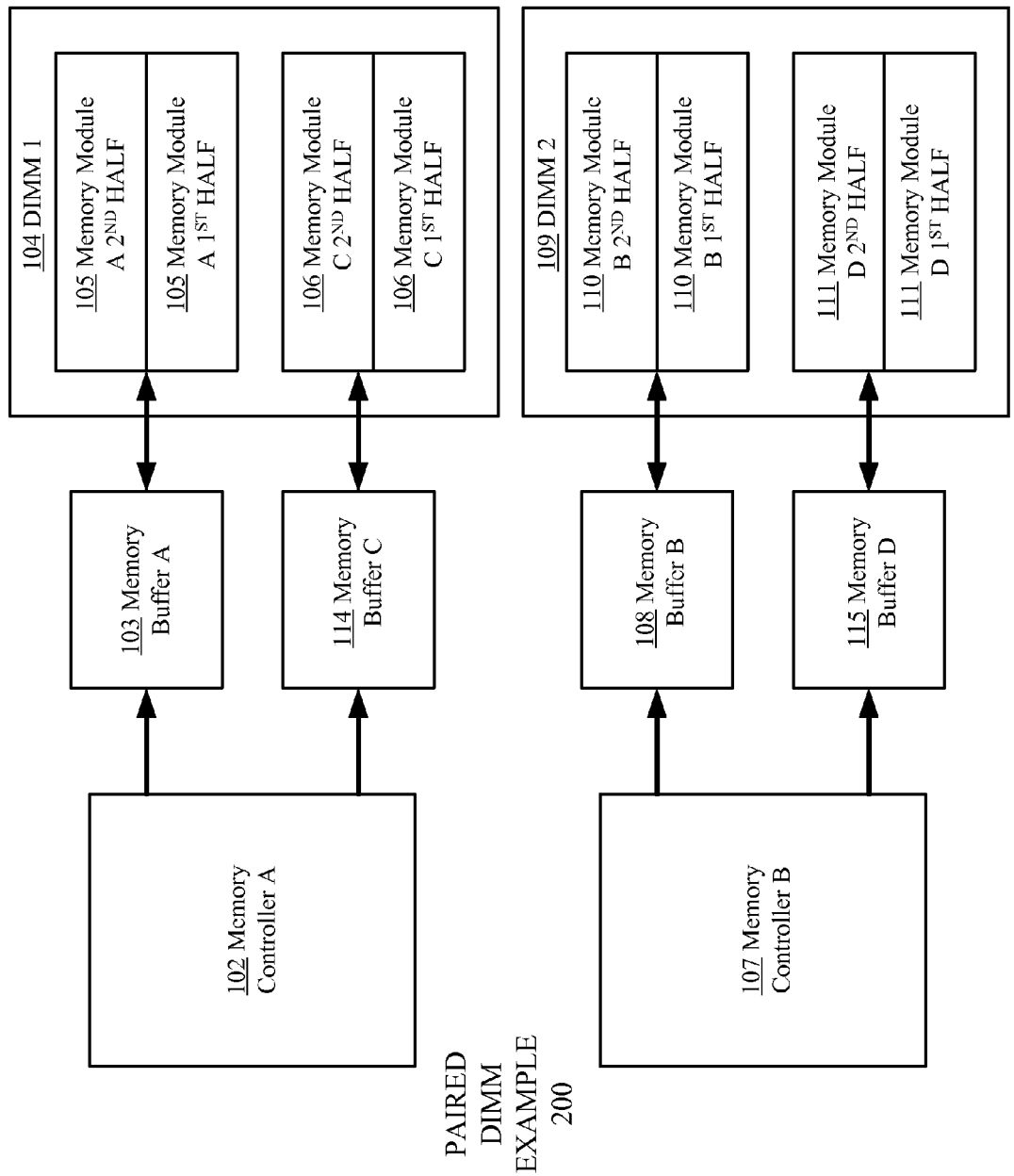
FIG. 2A depicts a memory system with paired DIMMs, consistent with embodiments of the present disclosure.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION

Aspects of the present disclosure relate to data storage, more particular aspects relate to allocating memory address space between Dual In-line Memory Modules (DIMMs) using memory controllers. While the present disclosure is not necessarily limited to such applications, various aspects of the disclosure can be appreciated through a discussion of various examples using this context.

Embodiments of the present disclosure can be employed to a methodology of storing data on DIMMs. Various embodiments are directed toward memory controllers that are configured to operate in a plurality of different memory modes in which the address space of the system is allocated differently within the DIMMs. Various modes take into consideration the physical and logical boundaries of the DIMMs when allocating the address space of the system. This can be particularly useful for facilitating the transfer of data between DIMMs, providing power savings, and for other reasons.

In certain embodiments, the memory controller can allocate address space to each DIMM of a pair of DIMMs by logically dividing each DIMM into top and bottom sections. Address space can be allocated to a top section of a first DIMM and a bottom section of a second DIMM. Moreover, the bottom section of the first DIMM and the top section of the second DIMM can remain unallocated. The memory controller can also be configured to enter a second mode that allows for a DIMM from the pair of DIMMs to be turned off. This can be useful where the DIMM suffers failure, the DIMM has a large amount of empty space, there is a desire to decrease the power used by the system, etc. When entering this second mode, data can be moved from an allocated portion of one DIMM to an unallocated portion of another DIMM, e.g., moved from the top section of the first DIMM to a top section of the second DIMM or moved from the bottom section of the second DIMM to a bottom section of the first DIMM.

Furthermore, if data is stored on one DIMM and more storage space is necessary, the memory controller can be configured to enter a third mode in which the entire capacity of the DIMMs is allocated for use by the system, and further, the access to the DIMMs can be interleaved to improve access performance times. For instance, when entering this third mode, the memory controller can allocate the entire address space of each DIMM. The top section containing data stored, can then be moved from a DIMM to its paired DIMM or the bottom section containing data stored can be moved from a DIMM to its paired DIMM and interleaved access to the pair of DIMMs can be provided.

Consistent with embodiments, the memory controllers can contain the logic necessary to read and write to memory modules, such as dynamic random-access memory integrated circuits (DRAMS). Memory controllers can read and write to a memory module by selecting the row and column data addresses of the memory module. Memory modules in a memory system can be organized into groups along memory channels behind memory controllers and memory buffers to match the internal throughput of the system bus of a computer system. A memory controller can have multiple memory buffers, each memory buffer having multiple memory channels leading to one or more DIMMs. A DIMM can comprise a memory module group and two DIMMs can be paired together such that a memory controller can provide interleaved access to the pair of DIMMs.

Interleaving can be a way of spreading memory addresses evenly across DIMMs. By interleaving DIMMs, memory addresses are allocated to each memory module group in turn. For example, for an interleaved pair of DIMMs, if logical address 32 belongs to DIMM 1, then logical address 33 would belong to DIMM 2, logical address 34 would belong to DIMM 1, and so on. Interleaved memory can result in contiguous reads and contiguous writes using each DIMM in turn, instead of using the same one repeatedly. This can have higher memory throughput as each DIMM in a pair of DIMMs can be read or written to in parallel.

Embodiments of the present disclosure will now be described more fully hereinafter with reference to the accompanying figures. However, there can be several embodiments of the present invention and should not be construed as limited to the embodiments set forth. The embodiments disclosed are provided so that this disclosure can fully convey the scope of the invention to those skilled in the art. Therefore, the following detailed description is not to be taken in a limiting sense.

FIG. 1 depicts a diagram of a memory system 100, consistent with embodiments of the present disclosure. In various embodiments, the processor 101 can be connected to one or more memory controllers 102 and 107. The memory controllers 102, 107 can be part of the processor itself, as shown in FIG. 1. In various embodiments the memory controllers 102, 107 can be on a separate chip. In this embodiment, the processor contains a memory controller A 102 and a memory controller B 107.

Each memory controller can support one or more memory buffers 103 and 108. The memory buffer 103, 108 can be part of the memory controller 102, 107 or on a separate chip. Shown here, memory controller A 102 is connected to memory buffer A 103, and memory controller B 107 is connected to memory buffer B 108. Each memory controller 102, 107 or memory buffer 103, 108 can be connected to one or more DIMMs 104, 109 through one or more memory channels 112, 113. Shown here, memory buffer A 103 is connected to DIMM 1 104 through memory channel A 112, and memory buffer B 108 is connected to DIMM 2 109 through memory channel B 113. DIMMs 104, 109 can be connected to one or more memory modules 105, 106, 110, and 111. Shown here, DIMM 1 104 is connected to memory module A 105 and memory module C 106 and DIMM 2 109 is connected to memory module B 110 and memory module D 111.

FIG. 2A depicts a memory system with paired DIMMs 200, consistent with embodiments of the present disclosure. The example may include memory controllers 102, 107 memory buffers 103, 108, 114, and 115, DIMMs 104, 109, and memory modules 105, 106, 110, and 111. Memory controller A 102 is shown to be connected to memory buffer A 103 and memory buffer C 114 and memory controller B 107 is shown to be connected to memory buffer B 108 and memory buffer D 115. Memory buffers 103, 114, 108, and 115 can be a region of a memory storage used to temporarily store data while it is being moved from one place to another, in this case, from the memory controllers 102, 107 to the DIMMs 104, 109 or from the DIMMs 104, 109 to the memory controllers 102, 107.

Consistent with various embodiments, memory controllers 102, 107 can logically divide the space of memory modules 105, 106 of a DIMM 104 into two sections. For example, as shown, memory controller A 102 can divide memory module A 105 and memory module C 106 of DIMM 1 104 into a first half and a second half. Also, memory controller B 107 can divide memory module B 110 and memory module D 111 of DIMM 2 109 into a first half and a second half. However, this example is only for descriptive purposes and other embodiments can be used. For instance, one memory controller can be used to divide the memory modules of both DIMM 1 104 and DIMM 2 109 into two sections. Furthermore, the memory modules of the DIMMs do not necessarily have to be divided into two equal halves. In some embodiments, the first sections can be larger than the second sections, in others, the second sections can be larger than the first sections.

Memory controller 102, 107 can use the divisions for allocating memory according to a plurality of different memory modes. In a first memory mode, the memory controller 102, 107 can allocate memory address space in the first section of DIMM 1 104 and the second section of DIMM 2 109. The other section of each respective DIMM can remain unallocated such that the allocated section of DIMM 1 104 corresponds to an unallocated memory address space half of DIMM 2 109 and the allocated half of DIMM 2 109 corresponds to an unallocated memory address space half of DIMM 1 104. For example, as depicted in memory mode 1 202 of FIG. 2B, memory controller A 102 may allocate memory address space in the first half of memory module A 105 and memory module C 106 of DIMM 1 104 and memory controller B 107 can allocate memory address space in the second half of memory module B 110 and memory module D 111 of DIMM 2 109. However, this example is only for descriptive purposes and other embodiments can be used. For instance, one memory controller can be in memory mode 1 202 and can be used to allocate the memory address space of the memory modules of both DIMM 1 104 and DIMM 2 109. Furthermore, the memory address space of the memory modules of the DIMMs 104, 109 do not necessarily have to be allocated into two equal halves. In some embodiments, the allocated memory space in the first sections can be larger than the allocated memory space in the second sections, in others, the allocated memory space in the second sections can be larger than the allocated memory space in the first sections.

Interleaving can be used by placing and accessing data in corresponding array elements of each memory module, i.e. memory modules 105, 106, 110, and 111. For example, each memory module can be thought of as an array that has elements E[0] to E[63]. When the memory modules are interleaved, data that takes up four addresses can be stored in element E[0] of memory module A 105, E[0] of memory module B 110, E[0] of memory module C 106, and E[0] of memory module D 111.

Figure 2B:
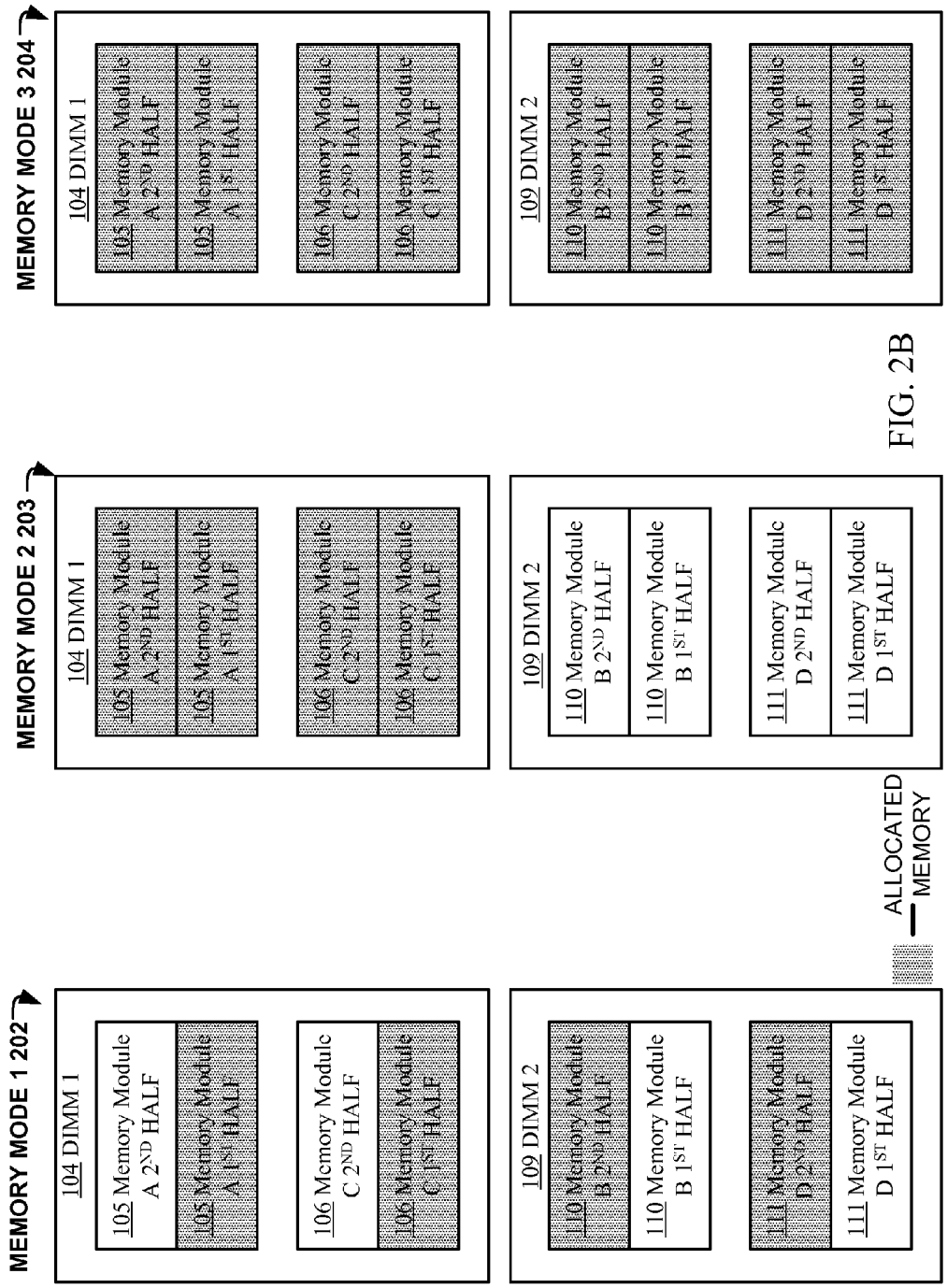
FIG. 2B depicts three configurations of a pair of DIMMs when a memory controller is in three different memory modes, consistent with embodiments of the present disclosure.

However, by dividing the memory modules of the pair of DIMMs 104, 109 and allocating memory address space in a first half of DIMM 1 104 that corresponds to unallocated memory address space in a first half of DIMM 2 109 and allocating memory address space in a second half of DIMM 2 109 that corresponds to unallocated memory address space in a second half of DIMM 1 104, as depicted in memory mode 1 202 of FIG. 2B, memory controller 102, 107 can interleave the DIMMs 104, 109 such that data can be placed and accessed in the corresponding array elements of the first halves of DIMM 1 104 and the second halves of DIMM 2 109. For example, once again, each memory module can be thought of as an array that has elements E[0] to E[63]. The first half of the array elements for memory module A 105 and memory module C 106 for DIMM 1 104 can be divided and the memory address space of the first half of the array elements can be allocated. So, array elements E[0] to E[31] have been allocated. In addition, the second half of the array elements for memory module B 110 and memory module D 111 for DIMM 2 109 can be divided and the memory address space of the second half of the array elements can be allocated. So, array elements E[32] to E[63] have been allocated. Then, data that takes up four addresses can be stored in element E[0] of memory module A 105, E[32] of memory module B 110, E[0] of memory module C 106, and E[32] of memory module D 111.

Consistent with certain embodiments, when memory controller 102, 107 enters memory mode 1 202 and allocates memory address space in a first section of DIMM 1 104 that corresponds to unallocated memory address space in a first section of DIMM 2 109 and allocating memory address space in a second section of DIMM 2 109 that corresponds to unallocated memory address space in a second section of DIMM 1 104, it can be known what section the data resides in for each DIMM. Therefore, the data from the first section of DIMM 1 104 can be moved to the first section of DIMM 2 109 or the data from the second section of DIMM 2 109 can be moved to the second section of DIMM 1 104 and it can be ensured that data no longer resides in the DIMM that the data was moved from. Furthermore, because the allocated first sections are the same size as each other in the DIMMs 104, 109 and the allocated second sections are the same size as each other in the DIMMs 104, 109, it can also be ensured that the data being moved can not overlap or overwrite data that already exists in the DIMM.

Memory controller 102, 107 can also divide the memory modules of one DIMM from the pair of DIMMs 104, 109 into two sections and allocate memory address space in the first and second sections of the one DIMM and turn off the power to the second DIMM from the pair of DIMMs 104, 109. The memory controller 102, 107 can utilize this function in cases where not all the memory address space of the memory module is being utilized and power is being wasted in storing and retaining the data in all the DIMMs 104, 109 or in cases of DIMM failure, where the data can be moved onto one DIMM that is working and possibly avoid losing the data.

For example, as depicted in memory mode 2 203 in FIG. 2B, a system that includes the paired DIMMs 104, 109 can be in a power save mode where DIMM 2 109 is turned off. Memory controller A 102 can then divide memory module A 105 into a first half and second half and memory module C 106 into a first half and second half and allocate the memory address space of the first halves and second halves. Both first halves of memory module A 105 and memory module C 106 are arrays that have elements E[0] to E[31] and both second halves of memory module A 105 and memory module C 106 are arrays that have elements E[32] to E[63]. Then, data that takes up four addresses can be stored in element E[0] of memory module A 105, E[32] of memory module A 105, E[0] of memory module C 106, and E[32] of memory module C 106. Furthermore, if the system comes out of power save mode and needs more memory address space, such as in cases where the system is ramping up or the system is getting into performance mode, DIMM 2 109 can be turned on and memory controller B 107 can divide memory module B 110 into a first and second half and memory module D 111 into a first and second half. Then, the memory address space can be allocated in the second half of memory module B 110 and memory module D 111. The data in the second half of memory module A 105 can be moved to the second half of memory module B 110 and the data in the second half of memory module C 106 can be moved to the second half of memory module D 111. In addition, the memory address space in the second half of memory module A 105 and the second half of memory module C 106 can then be unallocated, as depicted in memory mode 1 202 in FIG. 2B.

Memory controller 102, 107 can also divide the memory modules of both DIMMs 104, 109 into two sections and allocate memory address space in the first and second sections of the DIMMs 104, 109, as depicted in memory mode 3 in FIG. 2B. The memory controller 102, 107 can utilize this function in cases where the system is in performance mode, data allocation is high, etc. The memory controller 102, 107 can then provide interleaved access to the pair of DIMMs 104, 109 where data is placed and accessed in corresponding array elements of each memory module. For example, as discussed herein, where data that takes up four addresses can be stored in element E[0] of memory module A 105, E[0] of memory module B 110, E[0] of memory module C 106, and E[0] of memory module D 111.

Alternatively, the memory controller 102, 107 can provide interleaved access to the pair of DIMMs 104, 109 where data is placed and accessed in the corresponding array elements of the first halves of DIMM 1 104 and the second halves of DIMM 2 109 and corresponding array elements of the second halves of DIMM 1 104 and the first halves of DIMM 2 109.

For example, as discussed herein, data that takes up four addresses can be stored in element E[0] of memory module A 105, E[32] of memory module B 110, E[0] of memory module C 106, and E[32] of memory module D 111. Furthermore, second data that takes up four addresses can be stored in element E[32] of memory module A 105 A, E[0] of memory module B 110, E[32] of memory module C 106, and E[0] of memory module D 111.

Figure 3:
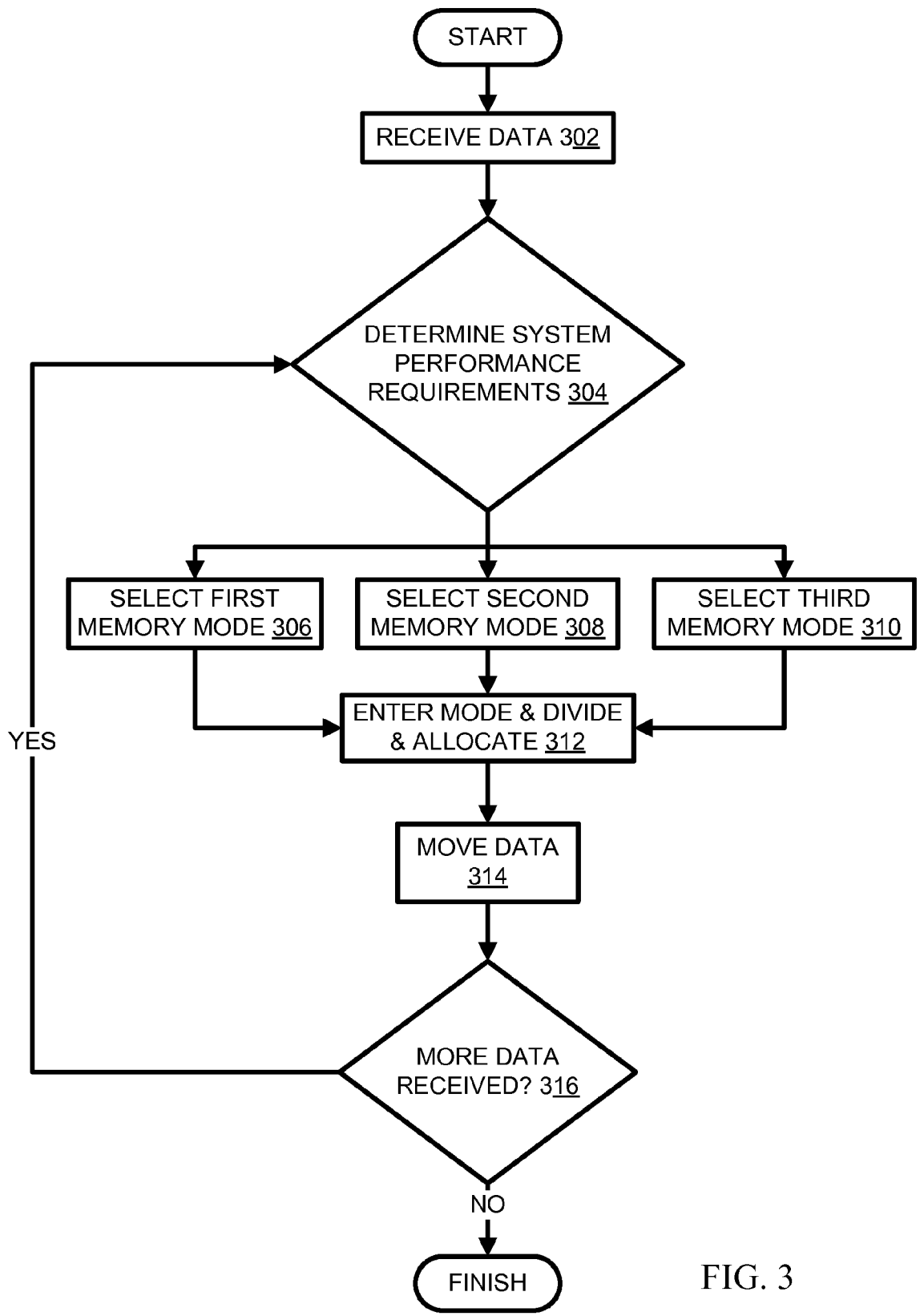
FIG. 3 depicts a flowchart of a method for allocating memory address space between DIMMs using a memory controller configured to operate in a plurality of memory modes, consistent with embodiments of the present disclosure.

FIG. 3 depicts a method 300 for allocating memory address space between DIMMs using a memory controller configured to operate in a plurality of memory modes, consistent with embodiments of the present disclosure. In operation 302, data can be received and in operation 303, system performance requirements can be determined. The amount of data received, the type of data received, etc. can impact the system performance requirements. Examples of system performance requirements can include whether the system is in a power save mode, whether the system is starting up, and whether the system is in performance mode.

By determining the system performance requirements, either a first memory mode can be selected in operation 306, a second memory mode can be selected in operation 308, or a third memory mode can be selected in operation 310. In first memory mode, the memory controllers, i.e. memory controllers 102, 107, can divide the space of memory modules, i.e. memory modules, of a pair of DIMMs, i.e. DIMMs 104, 109, into two sections. The memory controllers can then allocate memory address space in the first section of the first DIMM and the second section of the second DIMM so that the allocated memory address space section of the first DIMM corresponds to an unallocated memory address space section of the second DIMM and the allocated memory address space section of the second DIMM corresponds to an unallocated memory address space section of the first DIMM.

In second memory mode, the memory controller can divide the memory modules of one DIMM from the pair of DIMMs into two sections and allocate memory address space in the first and second sections of the one DIMM and turn off the power to the second DIMM from the pair of DIMMs. In third memory mode, the memory controller can divide the memory modules of both DIMMs into two sections and allocate memory address space in the first and second sections of the DIMMs.

In operation 312, the memory controller can enter the selected memory mode and divides the memory modules and allocates the memory address space accordingly. In operation 313, the data is moved into the allocated memory address space in response to the memory mode of the memory controller and in operation 316, it is determined whether more data has been received and whether there is a change in system performance requirements. If more data is received, system performance requirements can be determined in operation 303. Present embodiments may be a system, a method, and/or a computer program product. The computer program product may include a computer readable storage medium (or media) having computer readable program instructions thereon for causing a processor to carry out aspects of the present invention.

Figure 4:
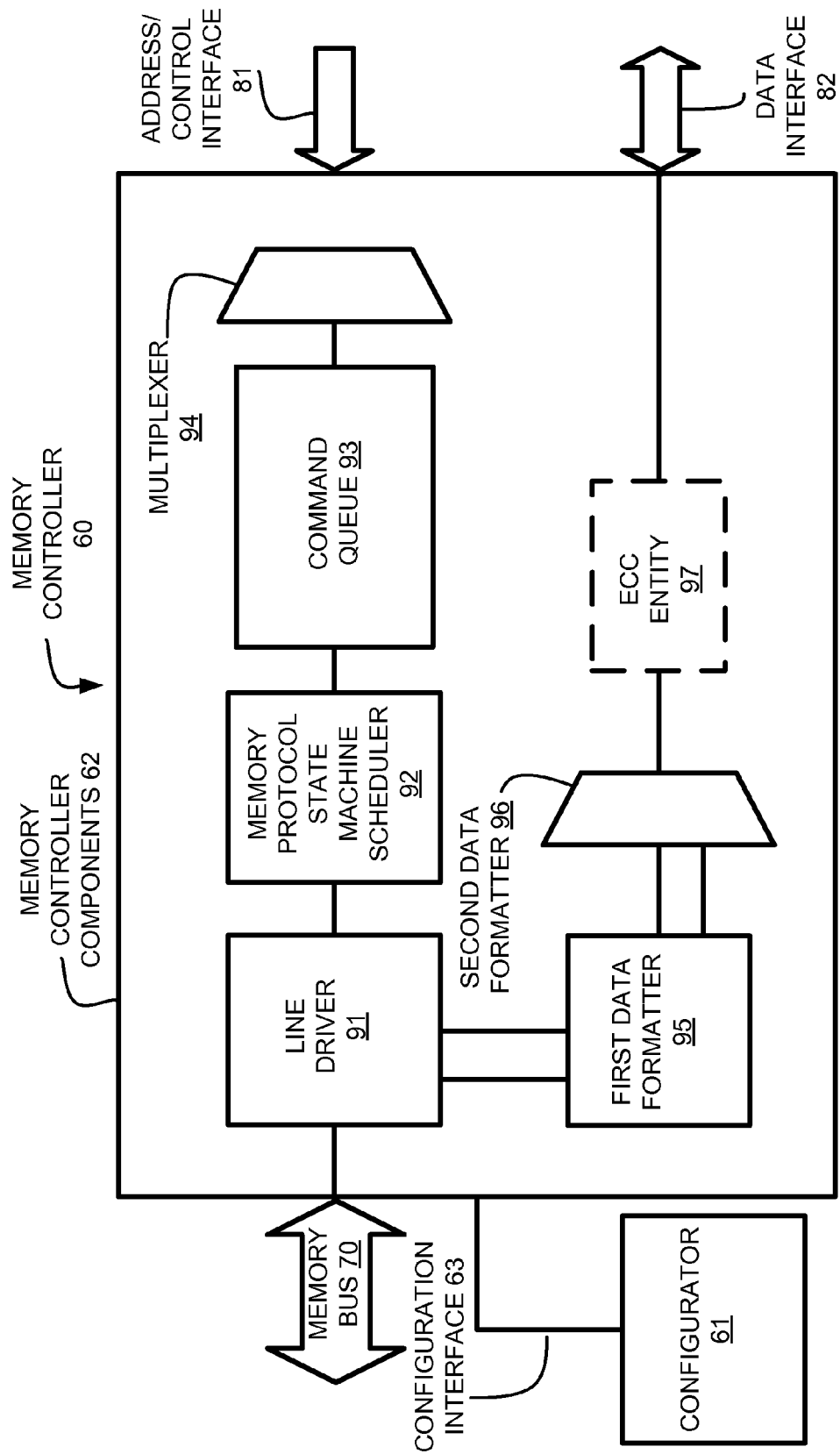
FIG. 4 depicts an embodiment of a memory controller that operates in a plurality of modes and is suitable for executing the computer software for allocating memory address space between DIMMs as described with respect to the figures herein.

FIG. 4 depicts an embodiment of a memory controller 60 that operates in a plurality of modes and is suitable for executing the computer software for allocating memory address space between DIMMs as described with respect to the figures herein. As shown, the memory controller 60 is coupled to a memory module (not shown in FIG. 4) by a memory bus 70 and to a processor (not shown in FIG. 4) by an address/control interface 81 and a data interface 82.

The memory controller 60 has the configurator 61 and a number of memory controller components 62. The memory controller components 62 and the configurator 61 can be coupled by means of the configuration interface 63. By means of the configuration interface 63, the configurator 61 can configure the memory controller components 62.

The memory controller components 62 include a line driver 91, a memory protocol state machine scheduler 92, a command queue 93 and a multiplexer 94 coupled between the memory bus 70 and the address/control interface 81.

Further, the memory controller components 62 include a first data formatter 95, a second data formatter 96 and an Error Correcting Code (ECC) entity 97 coupled between the line driver 91 and the data interface 82. The line driver 91 is configured to drive the connections of the memory bus 70. The memory protocol state machine scheduler 92 is configured to control the line driver 91. The command queue 93 is adapted to input address and control data received over the address/control interface 81 and the multiplexer 94 for the memory protocol state machine scheduler 92.

The first data formatter 95 coupled between the line driver 91 and the second data formatter 96 is configured to format data to be transmitted between the memory module and the processor. The second data formatter 96 can include a data concentrator and a data splitter for formatting data. The ECC 97 coupled between the second data formatter 96 and the data interface 82 can provide error correction.

The memory controller 60 can be part of a processor, network component, a graphics accelerator or the like. The interfaces 81 and 82 provide a connection for the memory controller to the rest of the system. Through the memory access interfaces 81, 82, the memory controller 60 can receive requests for memory accesses, and if the request requires, data for this request. Further, the memory controller 60 can also provide results like signaling completion or providing resulting data, e.g. read data through the interfaces 81, 82.

Request information, such as operation type, address or such is stored in the command queue 93. Depending on the connected memory module, for example a conventional one with one address/command address and control connection or a DIMM with two address and control connections, the queue 93 is split into a number of logical queues.

If data is received with the command, the ECC 97 can compute an error correction code and data is put into one part of the data buffer dependent on the configuration. Then, the data is formatted according to the number of data wires on the memory bus 70.

The memory protocol state machine scheduler 92 creates the signals on the address and control lines, either for one or for two groups of memory chips on the DIMM, for example. If there are two, it operates as two independent state machines. The detailed operations are transmitted over the memory bus 70 by means of the line driver 91 which guarantees the right electrical properties.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to explain the principles of the embodiments, the practical application or technical improvement over technologies found in the marketplace, or to enable others of ordinary skill in the art to understand the embodiments disclosed herein.

What is claimed is:

1. A computer-implemented method for allocating memory address space between dual in line memory modules (DIMMs) of a computer system, the method comprising:
   determining a performance requirement of the computer system;
   in response to determining a first performance requirement, the first performance requirement indicating to store data in first and second DIMMS using less than the entire address space of each of the first and second DIMMS, performing a first allocation of memory address space within the first and second DIMMs, each DIMM having a first address space portion and a second address space portion, wherein the respective first address space portions correspond with one another and the respective second address space portions correspond with one another, the first allocation including:

allocating the first address space portion of the first DIMM and the second address space portion of the second DIMM for storing data, wherein the second address space portion of the first DIMM and the first address space portion of the second DIMM are unallocated memory address spaces; and subsequent to performing a first allocation of memory address space, determining a second performance requirement, the second performance requirement indicating to store data in a single DIMM, performing a second allocation of memory address space within the first and second DIMMs, the second allocation including:

allocating the second address space portion of the first DIMM for storing data, moving any data stored in the second address space portion of the second DIMM to the second address space portion of the first DIMM, and turning off power supplied to the second DIMM.

2. The method of claim 1, further comprising:
providing interleaved access between the first address space portion of the first DIMM and the second address space portion of the second DIMM when the first performance requirement is determined.

3. The method of claim 1, further comprising:
subsequent to performing a second allocation of memory address space, determining a third performance requirement of the computer system, the third performance requirement indicating to store data in the first and second DIMMS using the entire address space of each of the first and second DIMMS; and in response to determining the third performance requirement, performing a third allocation of memory address space within the first and second DIMMs, the third allocation including:

turning on power supplied to the second DIMM, and allocating the first address space portion and the second address space portion of the second DIMM for storing data.

4. The method of claim 1, further comprising:
subsequent to performing a first allocation of memory address space, determining a third performance requirement of the computer system, the third performance requirement indicating to store data in the first and second DIMMS using the entire address space of each of the first and second DIMMS; and in response to determining the third performance requirement, performing a third allocation of memory address space within the first and second DIMMs, the third allocation including:

allocating the second address space portion of the first DIMM and the first address space portion of the second DIMM for storing data.

5. The method of claim 1, further comprising:
subsequent to performing a second allocation of memory address space, determining the first performance requirement; and in response to determining the first performance requirement, performing a third allocation of memory address space within the first and second DIMMs, the fourth allocation including:

turning on power supplied to the second DIMM, allocating the second address space portion of the second DIMM, moving any data stored in the second address space portion of the first DIMM to the second address space portion of the second DIMM, and deallocating the second address space portion of the first DIMM.

6. The method of claim 1, wherein the first address space portion and the second address space portion are the same size.

7. The method of claim 1, wherein a size of the first address space portion is different from a size of the second address space portion.

8. The method of claim 1, wherein the first and second DIMMs each include two or more memory modules.

* * * * *